(12) United States Patent
Okawa

(10) Patent No.: US 6,653,689 B2
(45) Date of Patent: Nov. 25, 2003

(54) SEMICONDUCTOR DEVICE HAVING ELECTROSTATIC PROTECTION CIRCUIT

(75) Inventor: Kazuhiko Okawa, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/873,370

(22) Filed: Jun. 5, 2001

(65) Prior Publication Data

US 2002/0020881 A1 Feb. 21, 2002

(30) Foreign Application Priority Data

Jun. 8, 2000 (JP) ........................................ 2000-172298

(51) Int. Cl.[7] ........................... H01L 29/72; H01L 23/62
(52) U.S. Cl. ...................... 257/362; 257/173; 257/355; 257/356
(58) Field of Search ................................ 257/173, 339, 257/355–356, 360, 361, 362

(56) References Cited

U.S. PATENT DOCUMENTS

| 5,311,042 A | * | 5/1994 | Anceau ....................... 257/173 |
| 5,519,242 A | * | 5/1996 | Avery .......................... 257/356 |
| 5,607,867 A | * | 3/1997 | Amerasekera et al. ........ 437/31 |
| 5,856,214 A | * | 1/1999 | Yu .............................. 438/133 |

FOREIGN PATENT DOCUMENTS

| JP | 62-002660 | 1/1987 |
| JP | 09-008147 | 1/1997 |
| JP | 09-293881 | 11/1997 |
| JP | A-9-293881 | 11/1997 |

OTHER PUBLICATIONS

U.S. patent application Ser. No. 09/866,782, Okawa et al., filed May 30, 2001.
U.S. patent application Ser. No. 09/866,800, Okawa et al., filed May 30, 2001.

* cited by examiner

Primary Examiner—Nathan J. Flynn
Assistant Examiner—Johannes P Mondt
(74) Attorney, Agent, or Firm—Oliff & Berridge, PLC

(57) ABSTRACT

A semiconductor device is provided with an electrostatic protection circuit that causes rapid breakdown of a Zener diode immediately after a static charge is applied, to discharge the static charge by a high-gain thyristor with good response characteristics, and that has a small surface area. When a static charge is applied, a Zener diode breaks down, which acts as a trigger to turn on a thyristor formed of an NPN bipolar transistor and a PNP bipolar transistor. The PNP bipolar transistor is formed of p-type, n-type, and p-type impurity diffusion regions formed in the thickness direction of the substrate and the Zener diode is formed of n-type and p-type impurity diffusion regions. An n-type impurity diffusion region is provided adjacent to a surface-layer p-type impurity diffusion region, and these p-type and n-type impurity diffusion regions are connected to a signal terminal through a silicide layer formed on the surfaces thereof.

8 Claims, 4 Drawing Sheets

SEMICONDUCTOR DEVICE HAVING ELECTROSTATIC PROTECTION CIRCUIT

Japanese Patent Application No. 2000-172298, filed on Jun. 8, 2000, is hereby incorporated by reference in its entirety.

TECHNICAL FIELD

The present invention relates to a semiconductor device that incorporates an electrostatic protection circuit, and a method of fabrication thereof.

BACKGROUND

The application of a surge voltage due to static electricity to a signal output terminal, signal input terminal, or signal input-output terminal of a semiconductor device could lead to destruction of internal circuitry. For that reason, it is usual to connect a protective circuit to such signal terminals.

In this case, the gate isolation films of the MOS transistors being protected are becoming thinner as micro-processing techniques become ever finer, and the gate withstand voltage (gate dielectrics breakdown voltage) is decreasing.

With processing at the 0.35 $\mu$m or 0.25 $\mu$m level, the gate withstand voltage is still comparatively high, so that breakdown of a Zener diode occurs when a static charge is applied, which acts as a trigger to cause snapback in an NPN bipolar transistor due to the bipolar operation thereof, making it possible to protect again static charges by imposing a voltage clamp state.

With processing below 0.18 $\mu$m, however, the gate withstand voltage decreases even further, so that the response characteristic is improved even further and thus it is not possible to protect a MOS transistor in this way without discharging static rapidly.

In such a case, an electrostatic protection circuit has been proposed that uses a thyristor instead of an NPN bipolar transistor, to employ the self-amplification operation of the thyristor (such as in Japanese Patent Application Laid-Open No. 9-293881, by way of example).

However, a thyristor is formed of a connection between an NPN bipolar transistor and a PNP bipolar transistor, it has a large number of terminals and the surface area thereof is larger, and thus it cannot be applied to micro-processing. Taking the above-mentioned Patent Application as an example, five electrically isolated impurity diffusion regions are required, which increases the surface area.

In addition, a prior-art electrostatic protection circuit has a resistor in the wiring path that is necessary for applying a static charge to a Zener diode, but, since the Zener diode cannot be made to break down rapidly, there is room for further improvement from the viewpoint of the response characteristic.

A further problem lies in the fact that the amplification capability of a bipolar transistor is dependent on the base length thereof, so that a bipolar transistor having a base length that is long in the lateral direction of the substrate, as in the prior art, would have a low amplification capability, and there is room for further improvement in that the capability of a PNP bipolar transistor is even lower.

SUMMARY

An objective of the present invention is to provide a semiconductor device having an electrostatic protection circuit that can be applied to micro-processing at 0.18 $\mu$m or less and which has a small surface area.

Another objective of the present invention is to provide a semiconductor device having an electrostatic protection circuit that has a good response, by causing a Zener diode to break down immediately after a static charge is applied, to act as a trigger for a thyristor.

A further objective of the present invention is to provide a semiconductor device having an electrostatic protection circuit that has a good response, by improving the amplification capabilities of bipolar transistors that form a thyristor.

A semiconductor device in accordance with a first aspect of the present invention relates to a semiconductor device having an electrostatic protection circuit such that static charge of a positive polarity that is applied to a signal terminal is discharged to a VSS power line side.

This semiconductor device comprises:

a semiconductor substrate;

a p-type and an n-type well regions formed on the semiconductor substrate;

a first p-type impurity diffusion region formed in a surface layer of the p-type well region;

a first n-type impurity diffusion region which is formed in a surface layer of the p-type well region and which is electrically isolated from the first p-type impurity diffusion region;

a second p-type impurity diffusion region which is formed in a surface layer of the p-type well region and which is electrically isolated from the first n-type impurity diffusion region;

a second n-type impurity diffusion region which is formed in a surface layer of the p-type and n-type well regions adjacent to the second p-type impurity diffusion region;

a third n-type impurity diffusion region connected to under surfaces of the second p-type and second n-type impurity diffusion regions in the p-type well region;

a third p-type impurity diffusion region connected to an under surface of the third n-type impurity diffusion region; and a low-resistance layer formed on a surface of the second p-type and n-type impurity diffusion regions.

A Zener diode is formed by a p-n junction between the third n-type and p-type impurity diffusion regions; an NPN bipolar transistor is formed by the first n-type impurity diffusion region, the p-well region, and the n-well region; and a PNP bipolar transistor is formed by the second p-type impurity diffusion region, the third n-type impurity diffusion region, and the third p-type impurity diffusion region.

In addition, the signal terminal is connected to the second p-type and n-type impurity diffusion regions through the low-resistance layer, and the VSS power line is connected to the first p-type and n-type impurity diffusion regions.

A semiconductor device in accordance with a second aspect of the present invention relates to a semiconductor device having an electrostatic protection circuit such that static charge of a negative polarity that is applied to a signal terminal is discharged to a VDD power line side.

The semiconductor device in accordance with the second aspect of the present invention can be fabricated by substituting n-type components for the p-type components of the semiconductor device in accordance with the first aspect of the invention, and substituting p-type components for the n-type components thereof.

DETAILED DESCRIPTION

Figure 1:
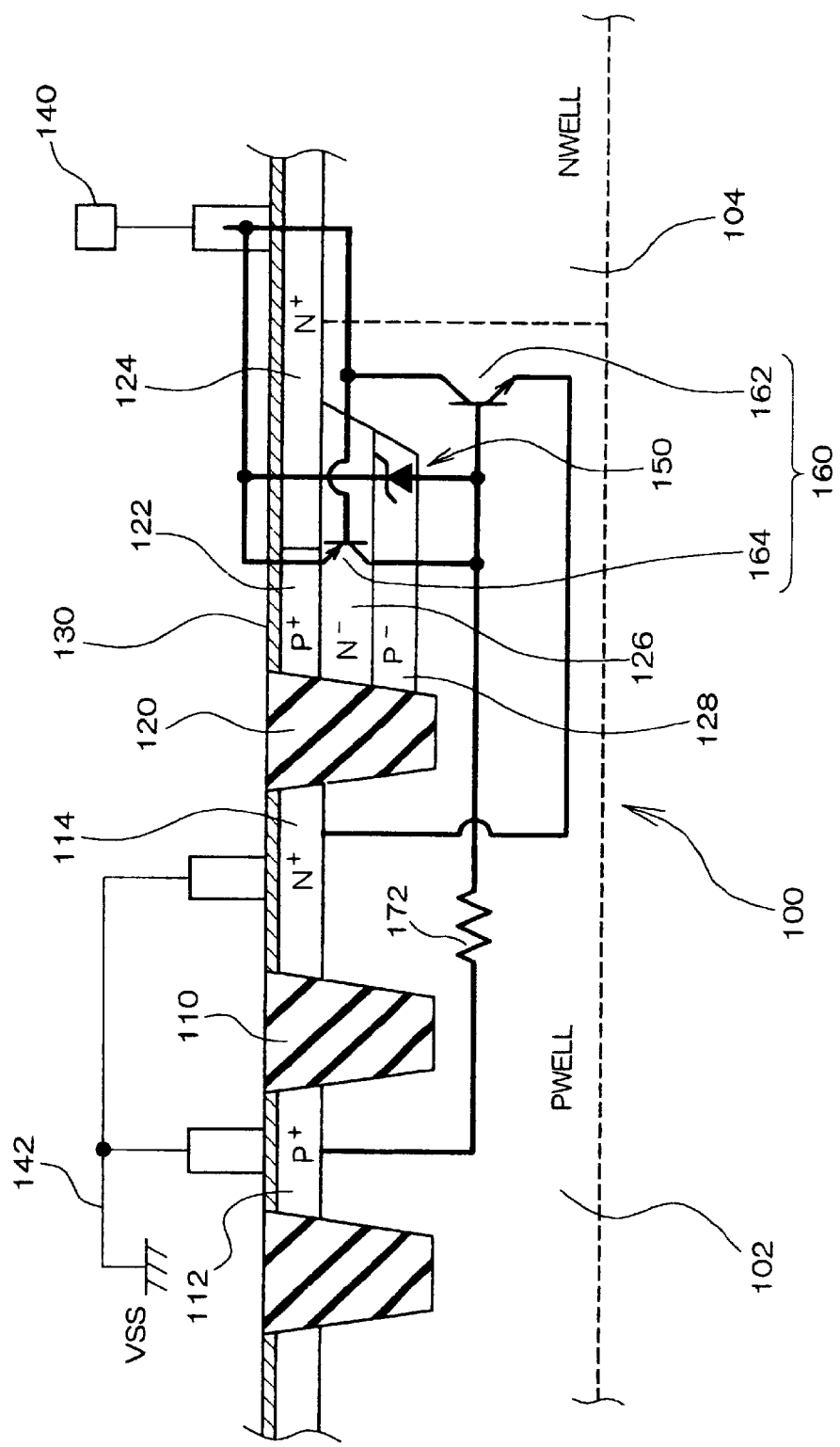
FIG. 1 is a sectional view of the structure of an electrostatic protection circuit of a semiconductor device in accordance with a first embodiment of the present invention.

A semiconductor device in accordance with one embodiment of the present invention is a semiconductor device having an electrostatic protection circuit such that static charge of a positive polarity that is applied to a signal terminal is discharged to a VSS power line side.

This semiconductor device comprises:

a semiconductor substrate;

p-type and n-type well regions formed on the semiconductor substrate;

a first p-type impurity diffusion region formed in a surface layer of the p-type well region;

a first n-type impurity diffusion region which is formed in a surface layer of the p-type well region and which is electrically isolated from the first p-type impurity diffusion region;

a second p-type impurity diffusion region which is formed in a surface layer of the p-type well region and which is electrically isolated from the first n-type impurity diffusion region;

a second n-type impurity diffusion region which is formed in a surface layer of the p-type and n-type well regions adjacent to the second p-type impurity diffusion region;

a third n-type impurity diffusion region connected to under surfaces of the second p-type and second n-type impurity diffusion regions in the p-type well region;

a third p-type impurity diffusion region connected to an under surface of the third n-type impurity diffusion region; and a low-resistance layer formed on a surface of the second p-type and n-type impurity diffusion regions.

A Zener diode is formed by a p-n junction between the third n-type and p-type impurity diffusion regions; an NPN bipolar transistor is formed by the first n-type impurity diffusion region, the p-well region, and the n-well region; and a PNP bipolar transistor is formed by the second p-type impurity diffusion region, the third n-type impurity diffusion region, and the third p-type impurity diffusion region.

The signal terminal is connected to the second p-type and n-type impurity diffusion regions through the low-resistance layer, and the VSS power line is connected to the first p-type and n-type impurity diffusion regions.

The semiconductor device in accordance with this embodiment of the present invention has three types of impurity diffusion regions that are disposed so as to be mutually isolated in the surface layer of the wells: a first p-type impurity diffusion region, a first n-type impurity diffusion region, and second p-type and n-type impurity diffusion regions. The occupied area of the substrate surface can thus be reduced, to provide an electrostatic protection circuit that can be applied to a semiconductor device designed for micro-processing.

In this case, the first necessity for the electrostatic discharge operation is the breakdown of the Zener diode. Since the route along which a voltage is applied to the Zener diode is from the signal terminal, to the low-resistance layer, and on to the second n-type impurity diffusion layer, it is possible to apply a voltage without going through the well, so that the Zener diode can break down rapidly.

This breakdown of the Zener diode acts as a trigger to turn first the NPN bipolar transistor and then the PNP bipolar transistor on, and activating the thyristor. This thyristor discharges the static electricity by causing a current to flow by self-amplification within a loop.

In this case, the PNP bipolar transistor is formed of a PNP junction in the thickness direction of the substrate, and the thickness of the third n-type impurity diffusion region that determines the base length thereof can be made sufficiently thin, in comparison with the structure in which it is formed in the lateral direction of the substrate, by adjusting the energy with which the ion doping is done.

It is therefore possible to increase the amplification capability of the PNP bipolar transistor, increasing the response characteristic of the electrostatic protection circuit. This makes it possible to protect a MOS transistor having a low withstand voltage, which is formed by micro-processing at 0.18 $\mu$m or less.

The object of the protection provided by the electrostatic protection circuit of this embodiment of the present invention may be an n-type MOS transistor that is disposed between the signal terminal and the VSS power line, to set the signal terminal to the VSS potential.

In such a case, a breakdown start voltage of the Zener diode may be set to be lower than a breakdown start voltage of the n-type MOS transistor.

This ensures that a current flows in the Zener diode before breakdown occurs in the MOS transistor, making it possible to turn the thyristor on and ensure a discharge path.

To reduce the surface area of the electrostatic protection circuit even further, the second p-type impurity diffusion region, the third n-type impurity diffusion region, and the third p-type impurity diffusion region may be electrically isolated from the first n-type impurity diffusion region by shallow trench isolation (STI). Similarly, the first p-type impurity diffusion region may be electrically isolated from the first n-type impurity diffusion region by shallow trench isolation. If the LOCOS method were to be used, the element separation/isolation films would extend in the lateral directions, increasing the surface area. In contrast thereto, the STI method enables regulation of the widths by means of grooves, making it possible to reduce surface areas.

A semiconductor device in accordance with another embodiment of the present invention relates to a semiconductor device having an electrostatic protection circuit included therein such that static charge of a negative polarity that is applied to a signal terminal is discharged to a VDD power line side.

The semiconductor device in accordance with this other embodiment of the present invention can be fabricated by substituting n-type components for the p-type components of the semiconductor device in accordance with the first aspect of the invention, and substituting p-type components for the n-type components thereof.

Specific examples of embodiments of semiconductor devices to which the present invention is applied are described below with reference to the accompanying figures.

First Embodiment

This first embodiment of the present invention relates to a semiconductor device having an electrostatic protection circuit such that static charge of a positive polarity that is applied to a signal terminal is discharged to a VSS power line side.

Configuration of Electrostatic Protection Circuit

A sectional view of the electrostatic protection circuit is shown in FIG. 1. In FIG. 1, a p-type well region 102 and an n-type well region 104 are formed on a silicon substrate 100.

A first p-type impurity diffusion region 112 and a first n-type impurity diffusion region 114 are formed in a surface layer of the p-type well region 102, on either side of a first element isolation region 110.

A second p-type impurity diffusion region 122 is formed in a surface layer of the p-type well region 102, electrically isolated from the first n-type impurity diffusion region 114 by a second element isolation region 120. Note that the first and second element isolation regions 110 and 120 are preferably formed by a method such as shallow trench isolation. This is because the LOCOS method extends element isolation regions in the lateral direction during the oxidation process, making it undesirable for microprocessing at 0.18 µm or less.

A second n-type impurity diffusion region 124 is formed in a surface layer of the p-type and n-type well regions 102 and 104, adjacent to the first p-type impurity diffusion region 112.

In the electrostatic protection circuit of this embodiment of the invention, the only impurity diffusion regions formed in the surface layer of the well regions 102 and 104 are the above-described diffusion regions 112, 114, 122, and 124. The surface area of the circuit is therefore reduced in comparison with an electrostatic protection circuit of the prior art that uses thyristors.

A third n-type impurity diffusion region 126 is formed to connect together the under surfaces of the second p-type and second n-type impurity diffusion regions 122 and 124 in the p-type well region 102. A third p-type impurity diffusion region 128 is provided connected to the under surface of this third n-type impurity diffusion region 126.

Ions of phosphorous (P) of a mass number of 31 could be doped into the third n-type impurity diffusion region 126 and ions of boron (B) of a mass number of 11 could be doped into the third p-type impurity diffusion region 128, by way of example. These two types of ion doping can be implemented by using the same mask in common.

A low-resistance layer such as a silicide layer 130 is formed over the substrate surface, except for the first and second element isolation regions 110 and 120.

A signal terminal 140 is connected to the second p-type and n-type impurity diffusion regions 122 and 124 by the silicide layer 130. A VSS power line 142 is connected to the first p-type and n-type impurity diffusion regions 112 and 114.

In this case, a Zener diode 150 is formed by the p-n junction between the third n-type and p-type impurity diffusion regions 126 and 128.

An NPN bipolar transistor 162 is formed by components such as the first n-type impurity diffusion region 114, the p-type well region 102, and the n-type well region 104. The first n-type impurity diffusion region 114 forms the emitter thereof, the p-type well region 102 and the first p-type impurity diffusion region 112 together form the base thereof, and the n-type well region 104 and the third n-type impurity diffusion region 126 forms the collector thereof.

A PNP bipolar transistor 164 is formed by the second p-type impurity diffusion region 122, the third n-type impurity diffusion region 126, and the third p-type impurity diffusion region 128. The second p-type impurity diffusion region 122 forms the emitter thereof, the third n-type impurity diffusion region 126 forms the gate thereof, and the third p-type impurity diffusion region 128 forms the collector thereof.

In this manner, the third n-type and p-type impurity diffusion regions 126 and 128 are used in common as parts of the Zener diode 150 and the PNP bipolar transistor 164, and, since these circuit elements 150 and 164 are formed in the lengthwise direction, they make it possible to reduce the surface area of the electrostatic protection circuit as described above.

Note that the NPN bipolar transistor 162 and the PNP bipolar transistor 164 form a thyristor 160. This thyristor 160 is turned on by a trigger from the Zener diode 150.

Equivalent Circuit of Electrostatic Protection Circuit

Figure 2:
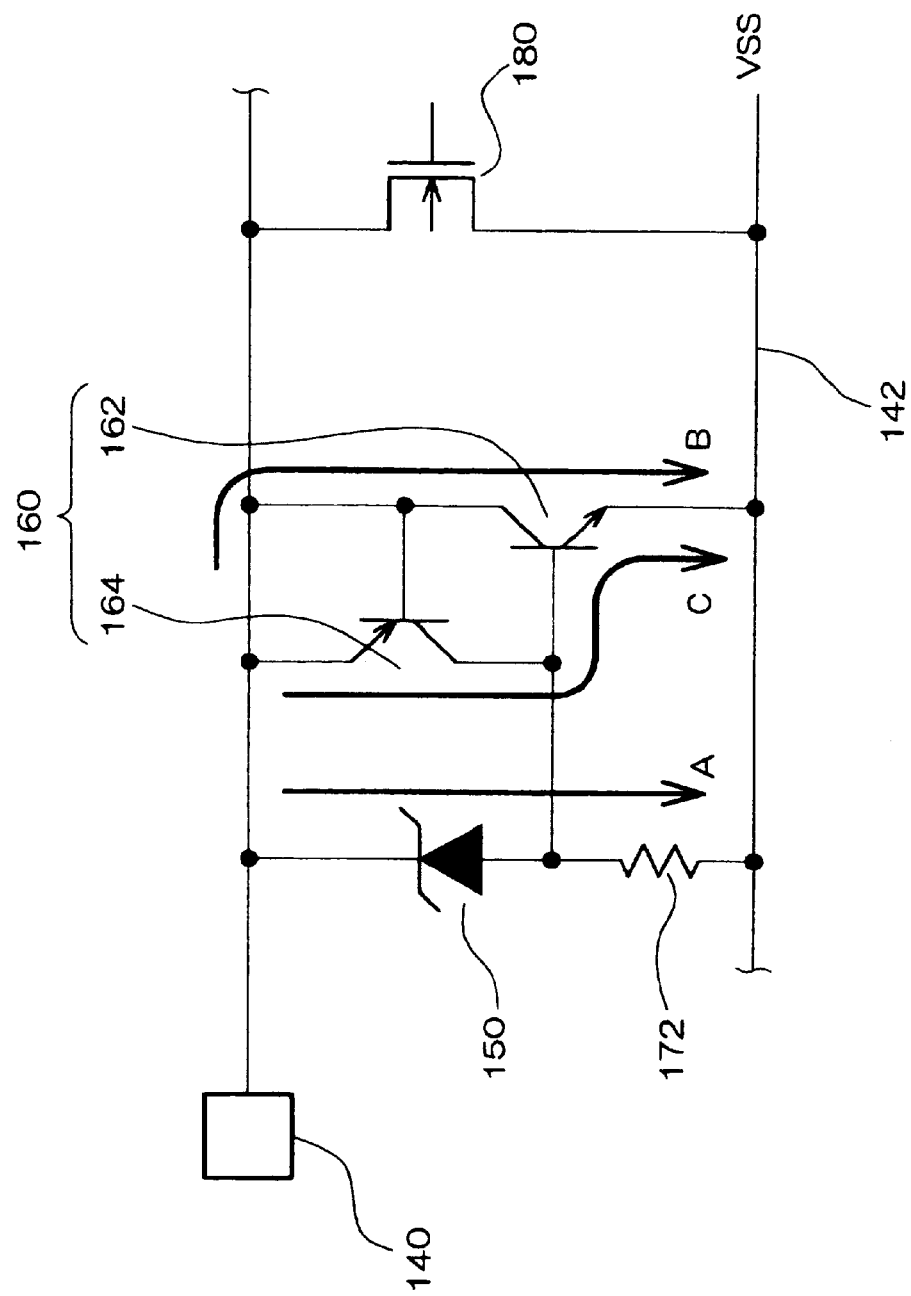
FIG. 2 is an equivalent circuit diagram of the electrostatic protection circuit of FIG. 1.

An equivalent circuit diagram of the electrostatic protection circuit of FIG. 1 is shown in FIG. 2. The signal terminal 140 is connected to internal circuitry by wiring. If the signal terminal 140 is used as an output terminal, by way of example, an example of such internal circuitry could be an n-type MOS transistor 180 that sets the potential of this signal (output) terminal 140 to VSS.

When an electrostatic charge of positive polarity is applied to the signal terminal 140, the electrostatic protection circuit shown in FIG. 2 forms a discharge path to prevent the destruction of the n-type MOS transistor 180.

First of all, the Zener diode 150 and a resistor 172 are connected between the signal terminal 140 and the VSS power line 142. This resistor 172 is formed from the p-type well region 102 of FIG. 1.

The thyristor 160 is also connected between the signal terminal 140 and the VSS power line 142. This thyristor 160 is formed by connecting the base of the NPN bipolar transistor 162 to the collector of the PNP bipolar transistor 164 and the base of the PNP bipolar transistor 164 to the collector of the NPN bipolar transistor 162. The emitter of the NPN bipolar transistor 162 is connected to the VSS power line 142, and the collector of the NPN bipolar transistor 162 and the emitter of the PNP bipolar transistor 164 are connected to the signal terminal 140.

Description of Operation

The voltage-current characteristic of the n-type MOS transistor 180 of FIG. 2 is such that a current starts to flow at an applied voltage of at least 0.7 V when the flow is in the positive direction from the substrate towards the drain, but breakdown (avalanche) occurs and a current suddenly starts to flow if a voltage on the order of 10 V is applied in the reverse direction.

With micro-processing at 0.18 µm or less in particular, the gate isolation film of the n-type MOS transistor 180 is thin so that withstand voltage thereof decreases and discharge must occur through the electrostatic protection circuit as soon as a static charge is applied.

To implement this, the electrostatic protection circuit of this embodiment operates as described below.

If a high voltage of a positive polarity is applied to the signal terminal 140, the reverse-direction characteristic of the Zener diode 150 ensures that a reverse current starts to flow at the breakdown start voltage. As a result, a current flows from the signal terminal 140 of FIG. 1, through the silicide layer 130, the second n-type impurity diffusion region 124, the Zener diode 150 (the third n-type impurity diffusion region 126 and the third p-type impurity diffusion region 128), the p-type well region 102, and the first p-type impurity diffusion region 112, to the VSS power line 142 (see the current path A in FIG. 2).

Since the reverse current flowing in the Zener diode 150 acts as a trigger to raise the base potential of the NPN bipolar transistor 162, the NPN bipolar transistor 162 turns on. As a result, a current flows from the signal terminal 140 of FIG. 1, through the silicide layer 130, the second n-type impurity diffusion region 124, the p-type well region 102, and the first n-type impurity diffusion region 114, to the VSS power line 142 (see the current path B in FIG. 2).

Since this on-operation of the NPN bipolar transistor 162 raises the base potential of the PNP bipolar transistor 164, the PNP bipolar transistor 164 turns on too. As a result, a current flows from the signal terminal 140 of FIG. 1, through the silicide layer 130, the second p-type impurity diffusion region 122, the third n-type impurity diffusion region 126, the third p-type impurity diffusion region 128, the p-type well region 102, and the first n-type impurity diffusion region 114, to the VSS power line 142 (see the current path C in FIG. 2).

The above-described turning on of the thyristor 160 implements a rapid discharge operation while causing self-amplification within the loop of the NPN and PNP bipolar transistor 162 and 164.

Providing that the voltage of the signal terminal 140 is restricted tope at least as high as the holding voltage inherent to that circuit, it is possible to cause rapid discharge of static charge that is applied to the signal terminal 140, since the latching-up of the thyristor 160 is maintained.

Note that it is necessary to implement this discharge operation before breakdown of the n-type MOS transistor 180 starts. For that reason, the breakdown start voltage of the Zener diode 150 is set to be lower than the breakdown start voltage of the n-type MOS transistor 180. This can be achieved by adjusting the impurity concentrations of the third n-type and p-type impurity diffusion regions 126 and 128.

To protect the n-type MOS transistor 180, which is fabricated by micro-processing at 0.18 μm or less and which has low withstand voltage, it is also necessary to increase the response characteristic from the occurrence of breakdown in the Zener diode 150 immediately after the static change is applied, to the triggering of the thyristor 160 and the discharge.

With this embodiment of the present invention, the response characteristic can be increased because the voltage at the signal terminal 140 is applied through the silicide layer 130 and the second n-type impurity diffusion region 124, not through the wells.

The value of the holding voltage can be adjusted by varying the base lengths of the NPN and PNP bipolar transistors 162 and 164. In this case, the PNP bipolar transistor 164 has a lower capability than the NPN bipolar transistor 162. However, with this embodiment of the present invention, the base length of the PNP bipolar transistor 164 can be set in the thickness direction of the semiconductor substrate, making it possible to set the base length to be sufficiently short (such as on the order of 0.1 μm) by adjusting the energy with which ions are doped therein, thus increasing the gain.

Note that the results of experiments show that the clamp voltage can be lowered to approximately 2.7 V by the thyristor 160, enabling a decrease in the load applied to the gate of the n-type MOS transistor 180. The response characteristic is also increased after the breakdown of the Zener diode until the transition to the clamp state after the snap-back caused by the bipolar operation of the thyristor 160.

Second Embodiment

Figure 3:
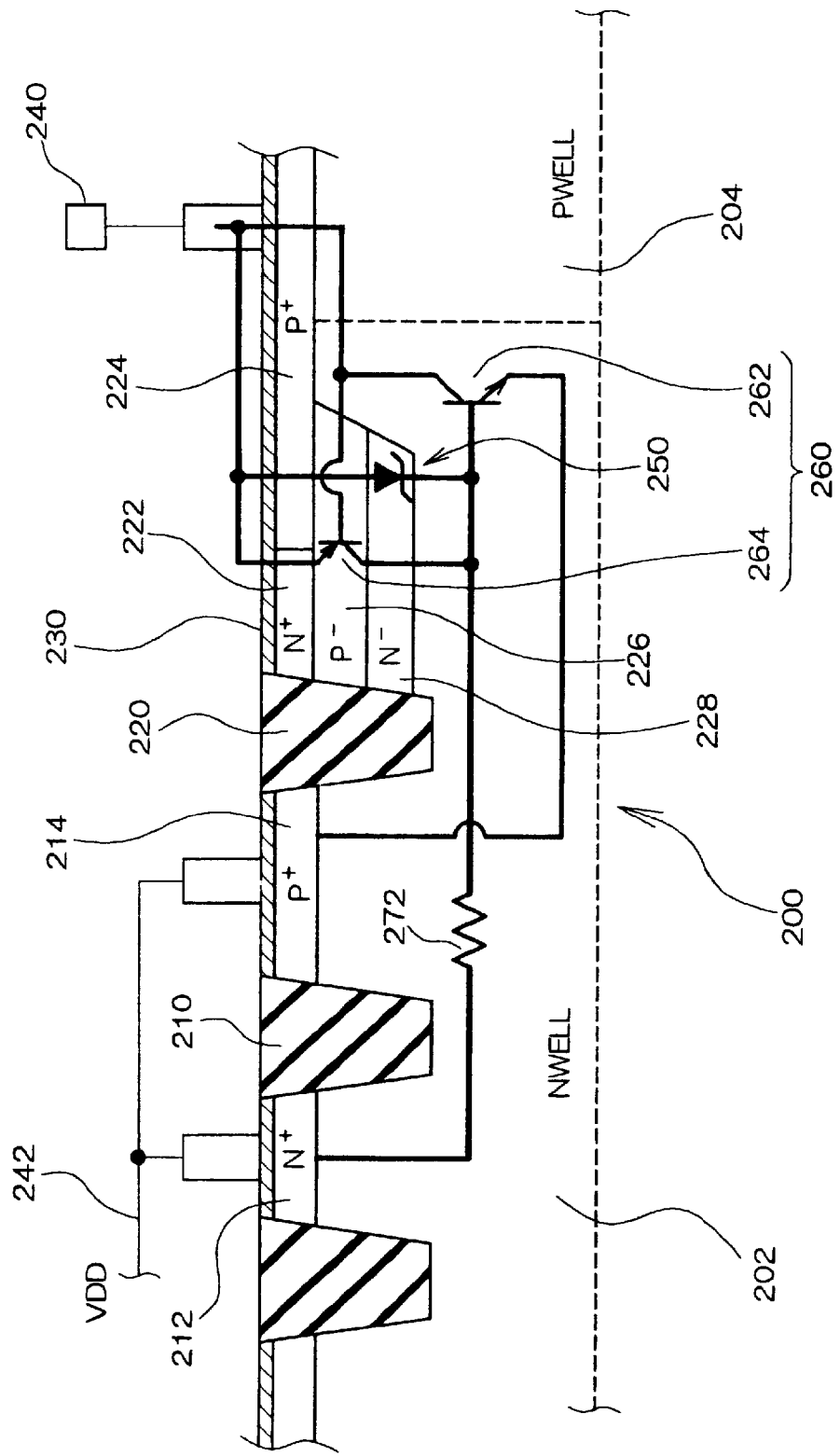
FIG. 3 is a sectional view of the structure of an electrostatic protection circuit of a semiconductor device in accordance with a second embodiment of the present invention.
Figure 4:
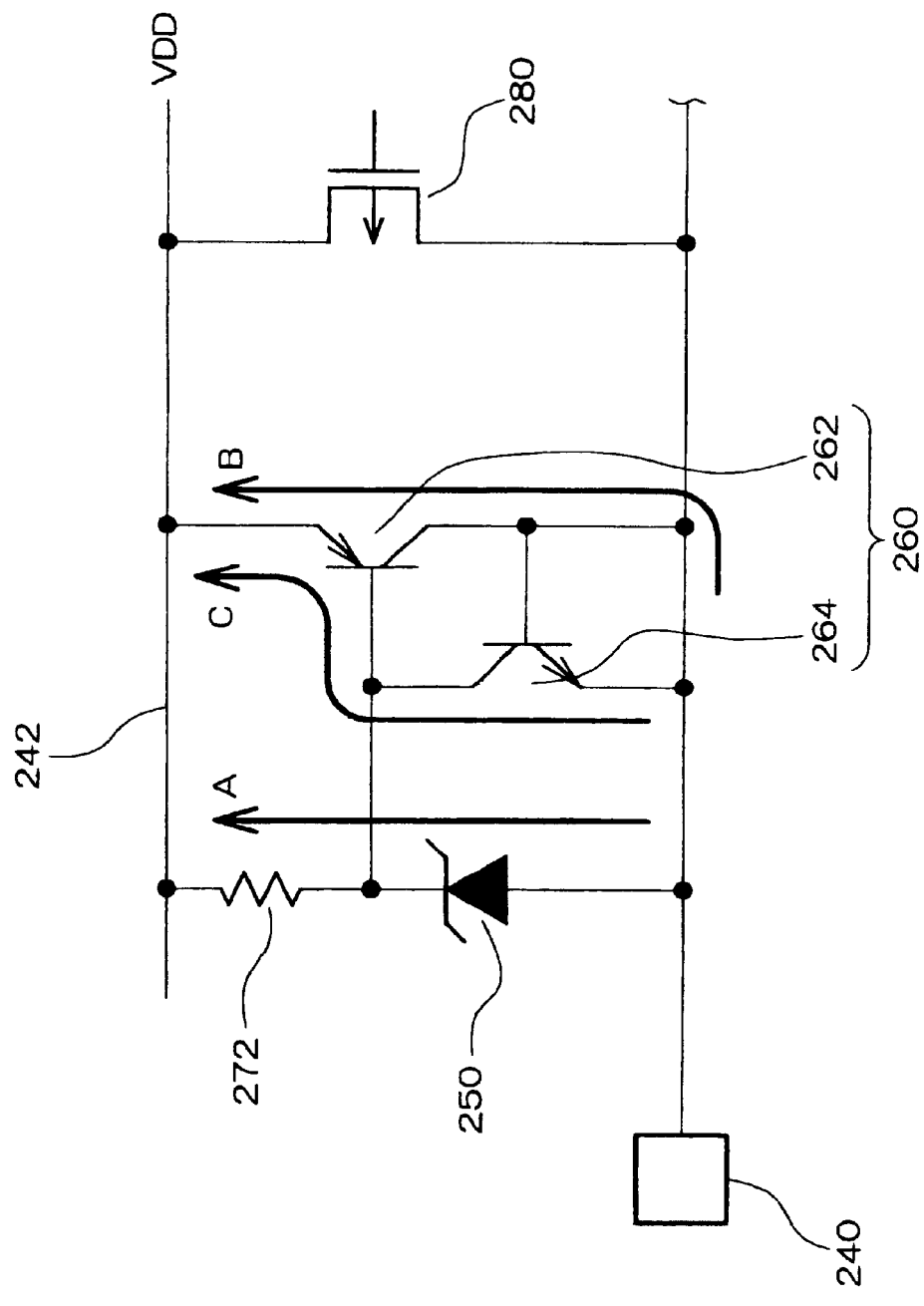
FIG. 4 is an equivalent circuit diagram of the electrostatic protection circuit of FIG. 3.

A sectional view of a semiconductor device in accordance with a second embodiment of the present invention, applied to an electrostatic protection circuit for a p-type MOS transistor, is shown in FIG. 3 and an equivalent circuit diagram of this electrostatic protection circuit is shown in FIG. 4.

The configuration shown in FIG. 3 differs from that of FIG. 1 in that the relationship of p-type and n-type components is reversed. Note that the boundary location between an n-type well region 202 (NWELL) and a p-type well region 204 (PWELL) could be shifted further to the left from the location shown in FIG. 3.

In other words, a first n-type impurity diffusion region 212 and a first p-type impurity diffusion region 214 are formed in a surface layer of the n-type well region 202 of a semiconductor substrate 200, on either side of a first element isolation region 210

A second n-type impurity diffusion region 222 is formed in a surface layer of the n-type well region 202, electrically isolated from the first p-type impurity diffusion region 214 by a second element isolation region 220.

A second p-type impurity diffusion region 224 is formed in a surface layer of the n-type and p-type well regions 202 and 204, adjacent to this second n-type impurity diffusion region 222.

A third p-type impurity diffusion region 226 is formed to connect together the under surfaces of the second n-type and second p-type impurity diffusion regions 222 and 224 in the n-type well region 202. A third n-type impurity diffusion region 228 is provided connected to the under surface of this third p-type impurity diffusion region 226.

A low-resistance layer such as a silicide layer 230 is formed over the substrate surface, except for the first and second element isolation regions 210 and 220.

A signal terminal 240 is connected to the second n-type and p-type impurity diffusion regions 222 and 224 by the silicide layer 230. A VDD power line 242 is connected to the first n-type and p-type impurity diffusion regions 212 and 214.

A Zener diode 250 is formed by the p-n junction between the third p-type and n-type impurity diffusion regions 226 and 228.

A PNP bipolar transistor 262 is formed by components such as the first p-type impurity diffusion region 214, the n-type well region 202, and the p-type well region 204. The first p-type impurity diffusion region 214 forms the emitter thereof, the n-type well region 202 and the first n-type impurity diffusion region 212 together form the base thereof, and the p-type well region 204 and the second p-type impurity diffusion region 224 together form the collector thereof.

An NPN bipolar transistor 264 is formed by the second n-type impurity diffusion region 222, the third p-type impurity diffusion region 226, and the third n-type impurity diffusion region 228. The second n-type impurity diffusion region 222 forms the emitter thereof, the third p-type impurity diffusion region 226 forms the base thereof, and the third n-type impurity diffusion region 228 forms the collector thereof.

The PNP bipolar transistor 262 and the NPN bipolar transistor 264 form a thyristor 260. This thyristor 260 is turned on by a trigger from the Zener diode 250.

Equivalent Circuit of Electrostatic Protection Circuit

An equivalent circuit diagram of the electrostatic protection circuit of FIG. 3 is shown in FIG. 4. The signal terminal 240 is connected to internal circuitry by wiring. If the signal terminal 240 is used as an output terminal, by way of example, an example of such internal circuitry could be a p-type MOS transistor 280 that sets the potential of this signal (output) terminal 240 to VDD.

When an electrostatic charge of negative polarity is applied to the signal terminal 240, the electrostatic protection circuit shown in FIG. 4 forms a discharge path to prevent the destruction of the p-type MOS transistor 280.

First of all, the Zener diode 250 and a resistor 272 are connected between the signal terminal 240 and the VDD power line 242. This resistor 272 is formed from the n-type well region 202 of FIG. 3. The thyristor 260 is also connected between the signal terminal 240 and the VDD power line 242.

Description of Operation

If a high voltage of a negative polarity is applied to the signal terminal 240, the reverse direction characteristic of the Zener diode 250 dictates that a reverse current at the breakdown start voltage starts to flow. As a result, charge moves along the path A in FIG. 4. In other words, the charge moves from the signal terminal 240, through the silicide layer 230, the second p-type impurity diffusion region 224, the Zener diode 250 (the third p-type impurity diffusion region 226 and the third n-type impurity diffusion region 228), the n-type well region 202, and the first n-type impurity diffusion region 212, to the VDD power line 242.

Since reverse current flowing in the Zener diode 250 becomes a trigger to raise the base potential of the PNP bipolar transistor 262, the PNP bipolar transistor 262 is turned on. As a result, charge moves along the path B in FIG. 3. In other words, the charge moves from the signal terminal 240, through the silicide layer 230, the second p-type impurity diffusion region 224, the n-type well region 202, and the first p-type impurity diffusion region 214, to the VDD power line 242.

Since this turning on of the PNP bipolar transistor 262 raises the base potential of the NPN bipolar transistor 264, the NPN bipolar transistor 264 is turned on. As a result, charge flows along the path C in FIG. 3. In other words, the charge moves from the signal terminal 240, through the silicide layer 230, the second n-type impurity diffusion region 222, the third p-type impurity diffusion region 226, the third n-type impurity diffusion region 228, the n-type well region 202, and the first p-type impurity diffusion region 214, to the VDD power line 242.

In this manner, the thyristor 260 is turned on, rapidly implementing a discharge operation while causing self-amplification within the loop of the PNP and NPN bipolar transistors 262 and 264.

Provided that the voltage of the signal terminal 240 is restricted to be at least as high as the holding voltage inherent to that circuit, it is possible to cause rapid discharge of static charge that is applied to the signal terminal 240, since the latching-up of the thyristor 260 is maintained.

Note that if a semiconductor substrate having a triple-well structure is used, either of the configurations of FIGS. 1 and 3 can be formed on the same semiconductor substrate.

The electrostatic protection circuit of the present invention is not necessarily limited to an output terminal; it can equally well be applied to an input terminal or an input-output terminal, with the essential point being that it is provided between the VDD power line and the VSS power line.

What is claimed is:

1. A semiconductor device having an electrostatic protection circuit included therein such that static charge of a positive polarity that is applied to a signal terminal is discharged to a VSS power line side, the semiconductor device comprising:

a semiconductor substrate;

p-type and n-type well regions formed on the semiconductor substrate;

a first p-type impurity diffusion region formed in a surface layer of the p-type well region;

a first n-type impurity diffusion region which is formed in a surface layer of the p-type well region and which is electrically isolated from the first p-type impurity diffusion region;

a second p-type impurity diffusion region which is formed in a surface layer of the p-type well region and which is electrically isolated from the first n-type impurity diffusion region;

a second n-type impurity diffusion region which is formed in a surface layer of the p-type and n-type well regions adjacent to the second p-type impurity diffusion region;

a third n-type impurity diffusion region materially connected to, and located below surfaces of the second p-type and second n-type impurity diffusion regions in the p-type well region;

a third p-type impurity diffusion region materially connected to a lower surface of the third n-type impurity diffusion region; and a low-resistance layer formed on a surface of the second p-type and n-type impurity diffusion regions, wherein a Zener diode is formed by a p-n junction between the third n-type and p-type impurity diffusion regions, wherein an NPN bipolar transistor is formed by the first n-type impurity diffusion region, the p-type well region, and the n-type well region, wherein a PNP bipolar transistor is formed by the second p-type impurity diffusion region, and the third n-type impurity diffusion region and the third p-type impurity diffusion region in which the Zener diode is formed, wherein the signal terminal is connected to the second p-type and n-type impurity diffusion regions through the low-resistance layer, and wherein the VSS power line is connected to the first p-type and n-type impurity diffusion regions.

2. The semiconductor device as defined by claim 1, wherein an n-type MOS transistor is provided between the signal terminal and the VSS power line, to substantially set the signal terminal potential to the VSS potential in the absence of n-type MOS transistor current flow in its ON state, and wherein a breakdown start voltage of the Zener diode is set to be lower than a breakdown start voltage of the n-type MOS transistor.

3. The semiconductor device as defined by claim 1, wherein the second p-type impurity diffusion region, the third n-type impurity diffusion region, and the third p-type impurity diffusion region are electrically isolated from the first n-type impurity diffusion region by shallow trench isolation.

4. The semiconductor device as defined by claim 1, wherein the first p-type impurity diffusion region is electrically isolated from the first n-type impurity diffusion region by shallow trench isolation.

5. A semiconductor device having an electrostatic protection circuit included therein such that static charge of a negative polarity that is applied to a signal terminal is discharged to a VDD power line side, the semiconductor device comprising:

a semiconductor substrate;

n-type and p-type well regions formed on the semiconductor substrate;

a first n-type impurity diffusion region formed in a surface layer of the n-type well region;

a first p-type impurity diffusion region which is formed in a surface layer of the n-type well region and which is electrically isolated from the first n-type impurity diffusion region;

a second n-type impurity diffusion region which is formed in a surface layer of the n-type well region and which is electrically isolated from the first p-type impurity diffusion region;

a second p-type impurity diffusion region which is formed in a surface layer of the n-type and p-type well regions adjacent to the second n-type impurity diffusion region;

a third p-type impurity diffusion region materially connected to, and located below surfaces of the second n-type and second p-type impurity diffusion regions in the n-type well region;

a third n-type impurity diffusion region materially connected to a lower surface of the third p-type impurity diffusion region; and a low-resistance layer formed on a surface of the second n-type and p-type impurity diffusion regions, wherein a Zener diode is formed by a p-n junction between the third p-type and n-type impurity diffusion regions, wherein a PNP bipolar transistor is formed by the first p-type impurity diffusion region, the n-type well region, and the p-type well region, wherein an NPN bipolar transistor is formed by the second n-type impurity diffusion region, and the third p-type impurity diffusion region and the third n-type impurity diffusion region in which the Zener diode is formed, wherein the signal terminal is connected to the second n-type and p-type impurity diffusion region through the low-resistance layer, and wherein the VDD power line is connected to the first n-type and p-type impurity diffusion regions.

6. The semiconductor device as defined by claim 5, wherein a p-type MOS transistor is provided between the signal terminal and the VDD power line, to substantially set the signal terminal potential to the VDD potential in the absence of p-type MOS transistor current flow in its ON state, and wherein a breakdown start voltage of the Zener diode is set to be lower than a breakdown start voltage of the p-type MOS transistor.

7. The semiconductor device as defined by claim 5, wherein the second n-type impurity diffusion region, the third p-type impurity diffusion region, and the third n-type impurity diffusion region are electrically isolated from the first p-type impurity diffusion region by shallow trench isolation.

8. The semiconductor device as defined by claim 5, wherein the first n-type impurity diffusion region is electrically isolated from the first p-type impurity diffusion region by shallow trench isolation.

* * * * *